(12) United States Patent
Chen

(10) Patent No.: US 8,736,318 B2
(45) Date of Patent: May 27, 2014

(54) MULTIPHASE CLOCK DIVIDER

(71) Applicant: NOVATEK Microelectronics Corp., Hsin-Chu (TW)

(72) Inventor: Yi-Kuang Chen, Taichung (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 15 days.

(21) Appl. No.: 13/670,466

(22) Filed: Nov. 7, 2012

(65) Prior Publication Data

US 2014/0062556 A1 Mar. 6, 2014

(30) Foreign Application Priority Data

Aug. 28, 2012 (TW) .............................. 101131192 A

(51) Int. Cl.
*H03K 23/00* (2006.01)
(52) U.S. Cl.
USPC .......................................... 327/117; 327/115
(58) Field of Classification Search
USPC .................................................. 327/115.117
See application file for complete search history.

(56) References Cited

U.S. PATENT DOCUMENTS

| | | | | |
|---|---|---|---|---|
| 8,082,462 | B1* | 12/2011 | Tidwell | 713/401 |
| 2006/0145732 | A1* | 7/2006 | Hsiao et al. | 327/105 |
| 2006/0290394 | A1* | 12/2006 | Tseng | 327/158 |
| 2008/0260087 | A1* | 10/2008 | Liang et al. | 375/376 |
| 2009/0267656 | A1* | 10/2009 | Stanley | 327/131 |
| 2011/0131439 | A1* | 6/2011 | Renner et al. | 713/401 |
| 2011/0161755 | A1* | 6/2011 | Hafed | 714/724 |
| 2013/0194881 | A1* | 8/2013 | Woo et al. | 365/191 |

* cited by examiner

*Primary Examiner* — Ryan Jager
(74) *Attorney, Agent, or Firm* — Winston Hsu; Scott Margo

(57) ABSTRACT

A multiphase clock divider includes: a reference clock generator for generating a plurality of reference clocks; and at least one output clock generator including a first multiplexer for selecting to output a selected reference clock, a second multiplexer for selecting to output a first selected input clock, a third multiplexer for selecting to output a second selected input clock, a first flip-flop for outputting a first sampling clock according to the selected reference clock and the first selected input clock, a second flip-flop for outputting a second sampling clock according to the first sampling clock and the second selected input clock, and a fourth multiplexer for selecting to output the first sampling clock or the second sampling clock to generate an output clock.

20 Claims, 8 Drawing Sheets

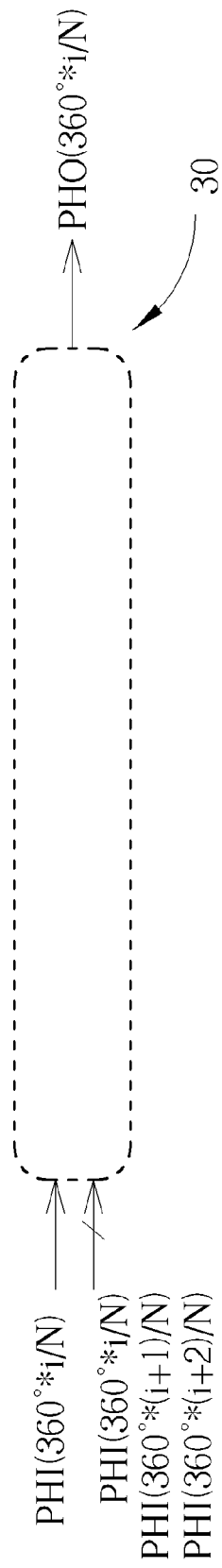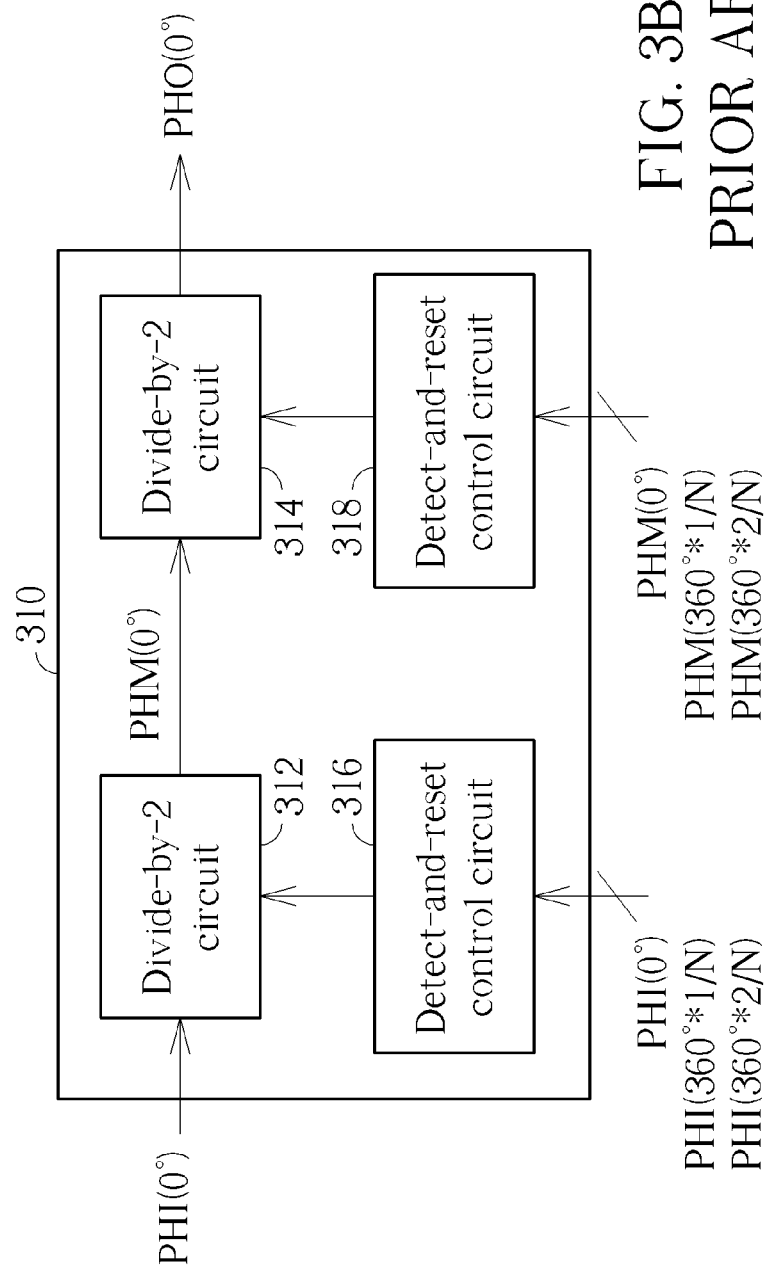
FIG. 3A PRIOR ART
FIG. 3B PRIOR ART

MULTIPHASE CLOCK DIVIDER

BACKGROUND OF THE INVENTION

1. Field of the Invention

The present invention relates to a multiphase clock divider, and more particularly, to a multiphase clock divider that can be designed according to timing margin requirements by generating reference clocks.

2. Description of the Prior Art

As integrated circuit systems become more complex, system requirements for clock stability and accuracy also become higher. A multiphase clock divider capable of simultaneously generating one or more clocks having a same frequency but different phases is widely utilized in various systems such as data transmission systems in a wired or wireless network, or microprocessor systems.

Please refer to FIG. 1A, which is a schematic diagram of a conventional multiphase clock divider 100. The multiphase clock divider 100 receives N input clocks $S_{in}$ and generates N divide-by-k output clocks $S_{out}$. As shown in FIG. 1A, if frequency of the input clocks $S_{in}$ is $f_o$, frequency of the output clocks $S_{out}$ will be $f_o/k$, wherein the N input clocks $S_{in}$ have N different phases, and the N output clocks $S_{out}$ also have N different phases respectively corresponding to the phases of the N input clocks $S_{in}$.

Most systems, however, can only operate with a small number of clocks; hence, another multiphase clock divider has N input clocks corresponding to one output clock. Please refer to FIG. 1B, which is a schematic diagram of a conventional multiphase clock divider 102. The multiphase clock divider 102 receives N input clocks $S_{in}$ and generates one divide-by-k output clock $S_{out}$. As shown in FIG. 1B, if frequency of the input clocks $S_{in}$ is $f_o$, frequency of the output clock $S_{out}$ will be $f_o/k$, wherein the N input clocks $S_{in}$ have N different phases, and the output clock $S_{out}$ may have N*k different kinds of phases. If the system requires more than one output clock, the structure in FIG. 1B can be duplicated to generate output clocks with a plurality of different phases.

A clock divider can be realized by utilizing a divide-by-2 clock dividing circuit. Please refer to FIG. 2A and FIG. 2B, where FIG. 2A illustrates a divide-by-2 clock divider 20 realized by utilizing a D flip-flop, and FIG. 2B is a waveform diagram of an input clock $S_{in}$ and an output clock $S_{out}$ of the divide-by-2 clock divider 20. As shown in FIG. 2B, when the input clock $S_{in}$ is switched from a lower voltage level to a higher voltage level, the output clock $S_{out}$ may be switched from a lower voltage level to a higher voltage level or from a higher voltage level to a lower voltage level. There are two kinds of different phase relationships between the input clock $S_{in}$ and the output clock $S_{out}$. When the divisor of the clock divider increases, there may be more than two kinds of phase relationships between the input clock $S_{in}$ and the output clock $S_{out}$. For example, when T divide-by-2 clock dividers are connected in series, a divide-by-$2^T$ clock divider can be achieved, and the output clock and the input clock of the divide-by-$2^T$ clock divider may possess $2^T$ kinds of different phase relationships.

A conventional method for calibrating phase of an output clock is detect-and-reset. For a divide-by-$2^T$ clock divider, each divide-by-2 clock divider may have an individual detecting circuit, and each detecting circuit utilizes three input clocks with different phases to determine which phase the output clock of each divide-by-2 clock divider has, so as to determine whether to perform a reset. For example, please refer to FIG. 3A, which is a schematic diagram of a conventional detect-and-reset multiphase clock divider 30. The multiphase clock divider 30 generates N output clocks PHO(360°*i/N), wherein i can be any positive integer between 1 and N. As shown in FIG. 3A, for each input clock PHI(360°*i/N) and the corresponding output clock PHO(360°*i/N), the multiphase clock divider 30 needs to utilize input clocks PHI(360°*i/N), PHI(360°*(i+1)/N), and PHI(360°*(i+2)/N) to perform detect-and-reset. Please refer to FIG. 3B, which takes a divide-by-4 clock divider 310 as an example, where the divide-by-4 clock divider 310 includes divide-by-2 circuits 312, 314 and detect-and-reset control circuits 316, 318. As shown in FIG. 3B, an input clock PHI(0°) is divided by the divide-by-2 circuit 312 to generate a medium clock PHM(0°), and the medium clock PHM(0°) is further divided by the divide-by-2 circuit 314 to generate an output clock PHO(0°). The medium clock PHM(0°) and the input clock PHI(0°) may possess two kinds of phase relationships; hence, the detect-and-reset control circuit 316 has to utilize three input clocks with different phases PHI(0°), PHI(360°*1/N), and PHI(360°*2/N) to determine which phase the medium clock PHM(0°) has, so as to determine whether to perform a reset. The output clock PHO(0°) and the medium clock PHM(0°) may also possess two kinds of phase relationships; hence, the detect-and-reset control circuit 318 has to utilize three medium clocks with different phases PHM(0°), PHM(360°*1/N), and PHM(360°*2/N) to determine which phase the output clock PHO(0°) has, so as to determine whether to perform a reset.

The medium clocks PHM(360°*1/N) and PHM(360°*2/N) must be further generated by utilizing PHI(360°*1/N) and PHI(360°*2/N) via different divide-by-2 clock dividers, respectively. Therefore, other input clocks and detect-and-reset control circuits are required for ensuring phases of the medium clocks PHM(360°*1/N) and PHM(360°*2/N) are accurate. As a result, when the divisor of the clock divider increases, even if only one output clock is required, the required input clocks and control circuits may still increase significantly. In addition, the detect-and-reset control circuits 316, 318 must utilize double the input frequency for detection, such that an operational speed of the system may be reduced.

The industry has further developed a delay type multiphase clock divider. Please refer to FIG. 4, which is a schematic diagram of a conventional delay type multiphase clock divider 40. As shown in FIG. 4, an output clock of each stage is a delay version of an output clock of the previous stage, where there is a fixed phase relationship between two adjacent output clocks. Since the highest frequency of the control signals in the delay type multiphase clock divider 40 is the same as the input frequency, operational speed of the delay type multiphase clock divider 40 may be higher than the detect-and-reset multiphase clock divider 30. Set-up time of the delay type multiphase clock divider 40, however, is $f_o/N$, wherein $f_o$ is frequency of the input clock and N is the number of phases. When N becomes greater, the set-up time will fall accordingly, which may limit the operational speed of the system.

SUMMARY OF THE INVENTION

The disclosure provides a multiphase clock divider that can be designed according to timing margin requirements by generating reference clocks, so that sampling flip-flops can be ensured to possess a set-up time which is at least half a cycle time of the input clocks.

An embodiment of the present invention discloses a multiphase clock divider, which comprises a reference clock generator, for generating a plurality of reference clocks having a same frequency, where a specific phase difference exists between the plurality of reference clocks; and at least one output clock generator. The output clock generator comprises a first multiplexer coupled to the reference clock generator, for selecting to output one of the plurality of reference clocks as a selected reference clock; a second multiplexer, for selecting to output an input clock from among a first group of a plurality of input clocks as a first selected input clock; a third multiplexer, for selecting to output an input clock from among a second group of the plurality of input clocks as a second selected input clock; a first flip-flop; a second flip-flop; and a fourth multiplexer, coupled to a data output terminal of the first flip-flop and a data output terminal of the second flip-flop, for selecting to output a first sampling clock or a second sampling clock to generate an output clock. The first flip-flop comprises a data input terminal, coupled to the first multiplexer, for receiving the selected reference clock; a clock input terminal, coupled to the second multiplexer, for receiving the first selected input clock; and the data output terminal, for outputting the first sampling clock. The second flip-flop comprises a data input terminal, coupled to the data output terminal of the first flip-flop, for receiving the first sampling clock; a clock input terminal, coupled to the third multiplexer, for receiving the second selected input clock; and the data output terminal, for outputting the second sampling clock.

Another embodiment of the present invention discloses a multiphase clock divider, which comprises a reference clock generator, for generating a plurality of reference clocks having a same frequency, where a specific phase difference exists between the plurality of reference clocks; and at least one output clock generator. The output clock generator comprises a first multiplexer coupled to the reference clock generator, for selecting to output one of the plurality of reference clocks as a selected reference clock; a selecting unit, for selecting to output a plurality of selected input clocks from among a plurality of input clocks; a reference clock delay unit, triggered by the plurality of selected input clocks, for delaying the selected reference clock by a plurality of different times to generate a plurality of delayed reference clocks; and a third multiplexer, coupled to the reference clock delay unit, for selecting to output one of the plurality of delayed reference clocks to generate an output clock.

Another embodiment of the present invention discloses a multiphase clock divider, which comprises a reference clock generator, which comprises a frequency dividing unit comprising an input terminal and an output terminal; an inverter, which comprises an input terminal coupled to the input terminal of the frequency dividing unit, and an output terminal; and a plurality of third flip-flops connected in series, each of which comprises a data input terminal, a clock input terminal, and a data output terminal. The multiphase clock divider further comprises at least one output clock generator comprising a first multiplexer, which comprises a plurality of input terminals respectively coupled to the data output terminals of the plurality of third flip-flops in the reference clock generator, and an output terminal; a second multiplexer comprising a plurality of input terminals and an output terminal; a third multiplexer comprising a plurality of input terminals and an output terminal; a first flip-flop; a second flip-flop; and a fourth multiplexer, which comprises two input terminals coupled to a data output terminal of the first flip-flop and a data output terminal of the second flip-flop, respectively, and an output terminal. The first flip-flop comprises a data input terminal, coupled to the output terminal of the first multiplexer; a clock input terminal, coupled to the output terminal of the second multiplexer; and the data output terminal. The second flip-flop comprises a data input terminal, coupled to the data output terminal of the first flip-flop; a clock input terminal, coupled to the output terminal of the third multiplexer; and the data output terminal. The data input terminal of a foremost third flip-flop among the plurality of third flip-flops is coupled to the output terminal of the frequency dividing unit, the data input terminal of each of the other third flip-flops is coupled to the data output terminal of a previous third flip-flop, and the clock input terminal of each of the plurality of flip-flops is coupled to the output terminal of the inverter.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3A is a schematic diagram of a conventional detect-and-reset multiphase clock divider.

FIG. 3B is a schematic diagram of a divide-by-4 clock divider of a conventional detect-and-reset multiphase clock divider.

DETAILED DESCRIPTION

Figure 1A:
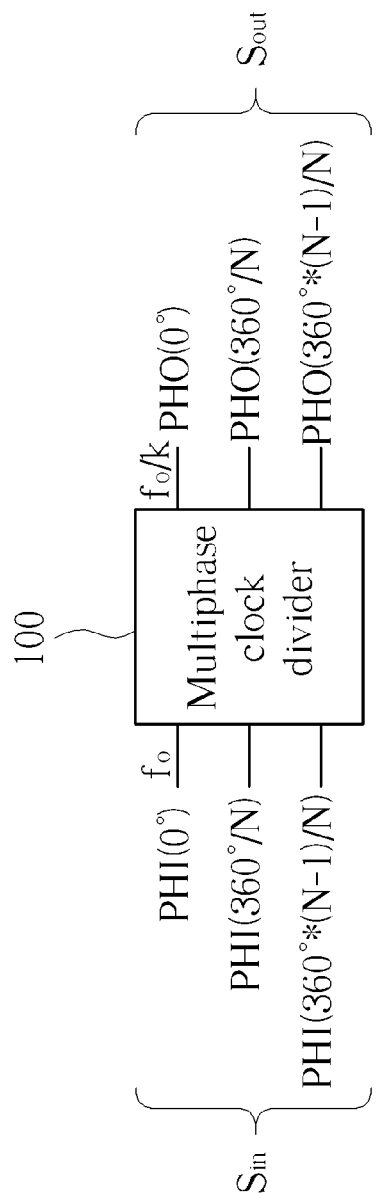
FIG. 1A is a schematic diagram of a conventional multiphase clock divider with N input clocks and N output clocks.
Figure 1B:
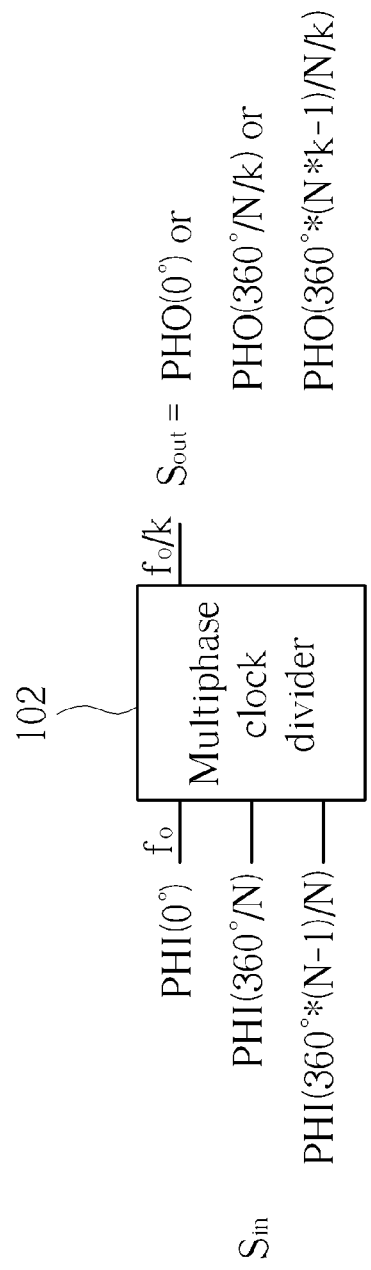
FIG. 1B is a schematic diagram of a conventional multiphase clock divider with N input clocks and one output clock.
Figure 2A:
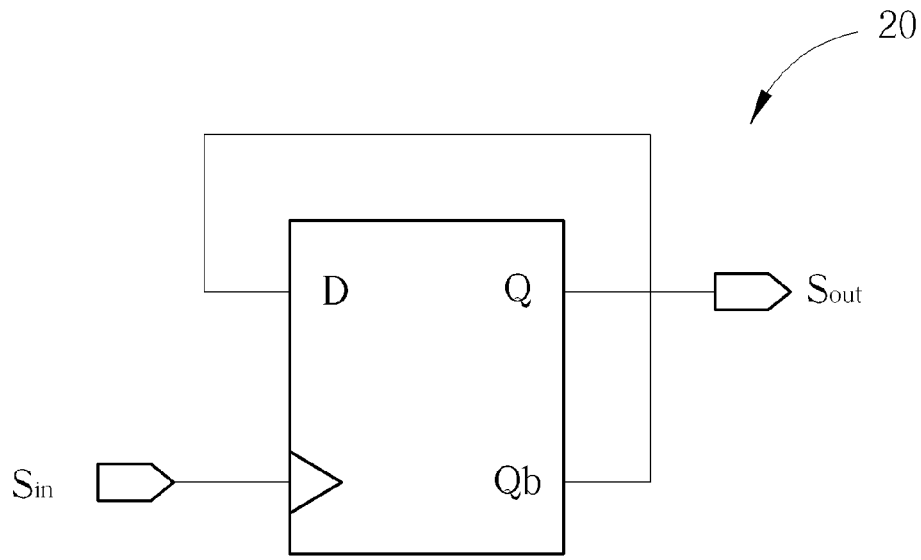
FIG. 2A is a schematic diagram of a conventional divide-by-2 clock divider.
Figure 2B:
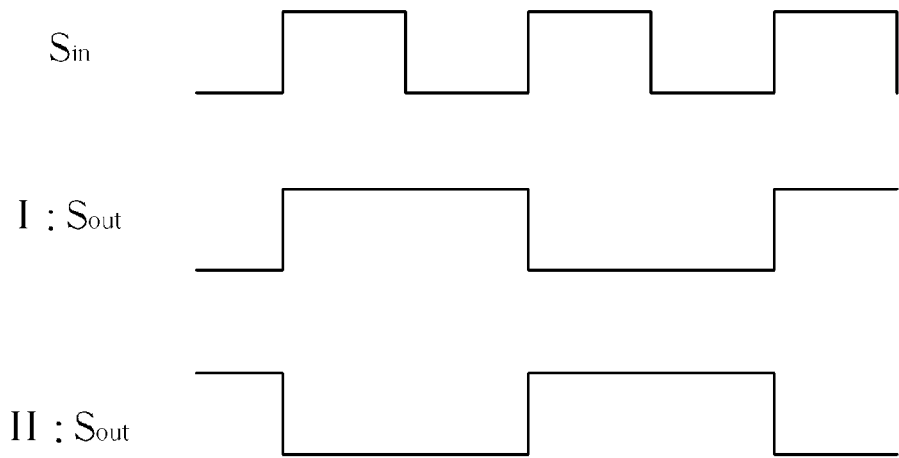
FIG. 2B is a waveform diagram of an input clock and an output clock of the divide-by-2 clock divider illustrated in FIG. 2A.
Figure 4:
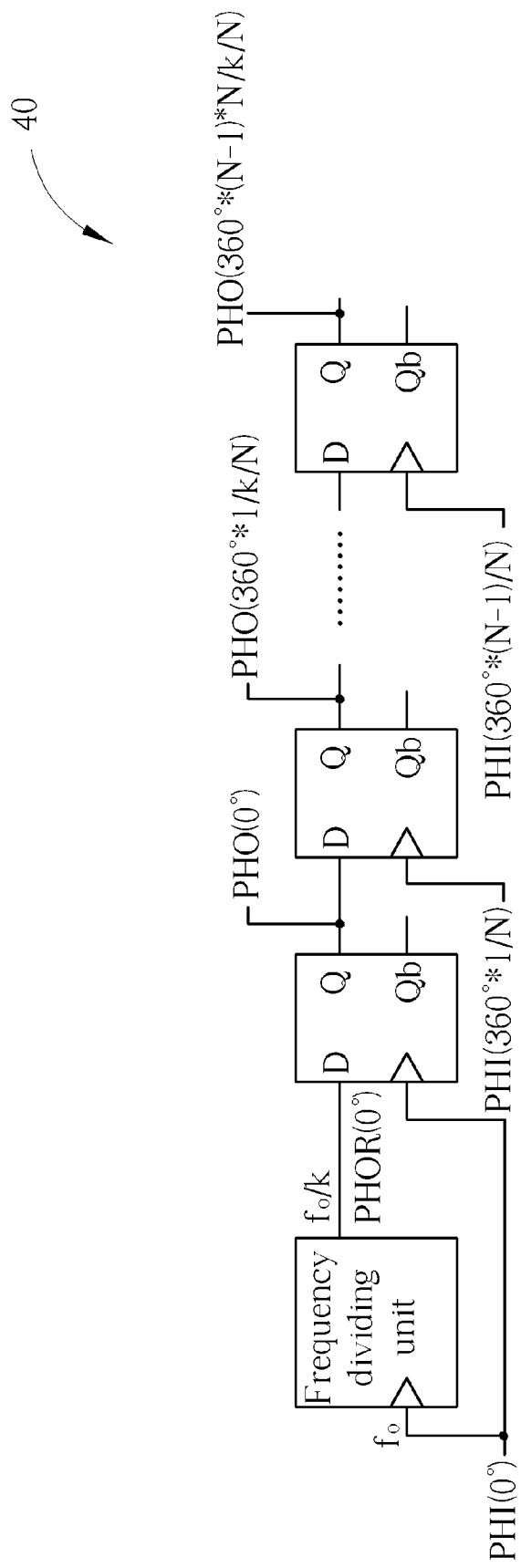
FIG. 4 is a schematic diagram of a conventional delay type multiphase clock divider.
Figure 5:
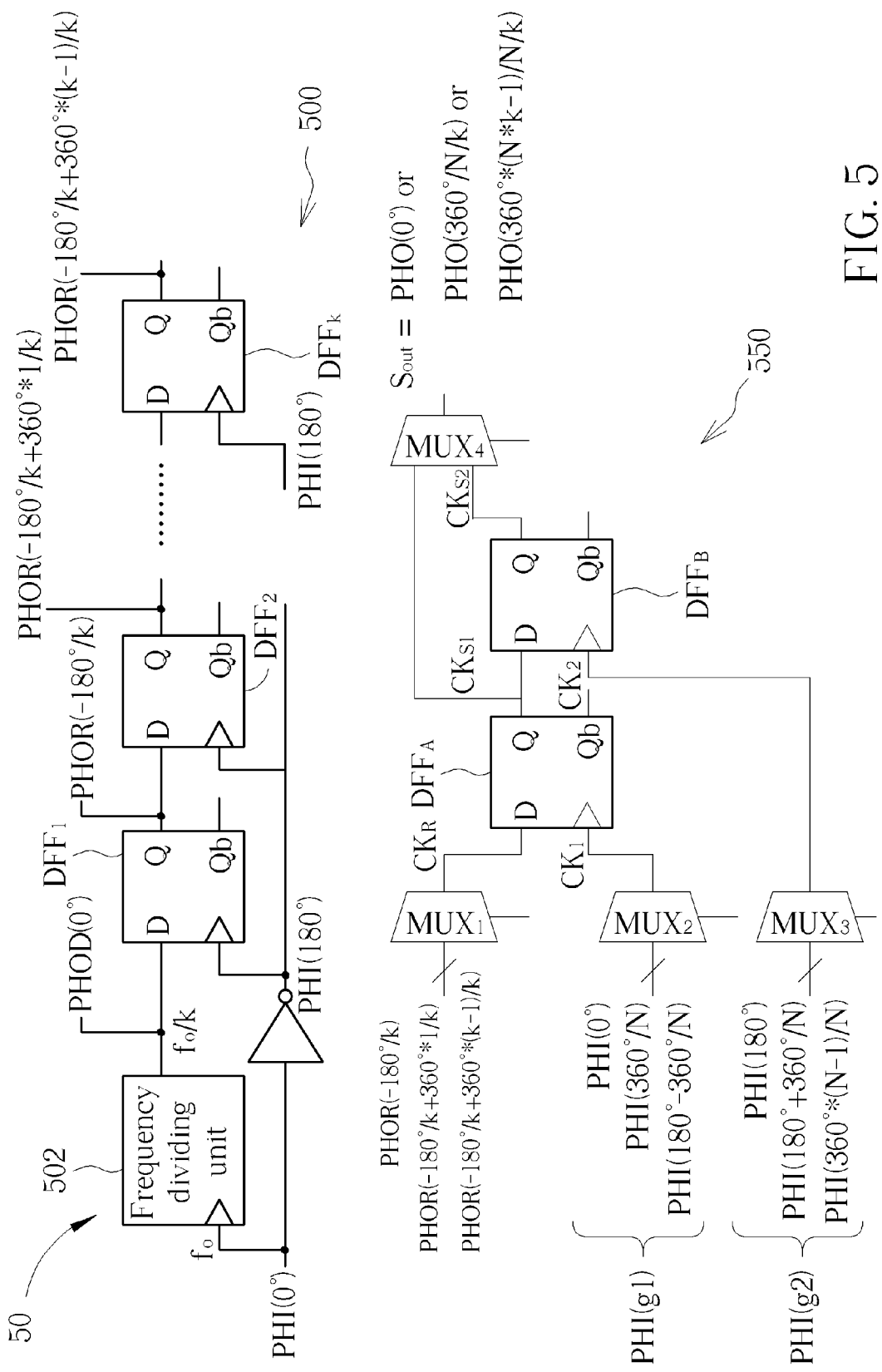
FIG. 5 is a schematic diagram of a multiphase clock divider according to an embodiment of the present invention.

Please refer to FIG. 5, which is a schematic diagram of a multiphase clock divider 50 according to an embodiment of the present invention. The multiphase clock divider 50 is a divide-by-k clock divider (wherein k is a positive integer). An upper part of FIG. 5 illustrates a reference clock generator 500 for generating k reference clocks. The reference clock generator 500 includes a frequency dividing unit 502, an inverter 504, and D flip-flops $DFF_1$-$DFF_k$. The implementation of the D flip-flops $DFF_1$-$DFF_k$ is only an example, and the flip-flops may be implemented by any type of flip-flop or other devices having delay functions, which are not limited herein. The frequency dividing unit 502 divides a non-inverted input clock PHI(0°) among input clocks PHI(360°*i/N) (i=0, 1, . . . N−1 where N can be any positive integer) by k to output a frequency-divided output clock PHOD(0°). The frequency dividing unit 502 can be realized by, for example, m divide-by-2 clock dividers 20 connected in series (wherein m is a positive integer), so that $k=2^m$. The inverter 504 converts the non-inverted input clock PHI(0°) to generate an inverted input clock PHI(180°) among the input clocks PHI (360°*i/N) (i=0, 1, . . . N−1 where N can be any positive integer). The D flip-flops $DFF_1$-$DFF_k$ are connected in series, wherein a clock input terminal of each of the D flip-flops $DFF_1$-$DFF_k$ receives the inverted input clock PHI(180°). A data input terminal of the D flip-flop $DFF_1$, coupled to the frequency dividing unit 502, is utilized for receiving the frequency-divided output clock PHOD(0°). A data input terminal of the D flip-flop $DFF_2$ is coupled to a data output terminal of the D flip-flop $DFF_1$. A data input terminal of the D flip-flop $DFF_k$ is coupled to a data output terminal of the D flip-flop $DFF_{k-1}$. The D flip-flops $DFF_1$-$DFF_k$ outputs reference clocks PHOR(−180°/k+360°*i/k), i=0, 1, 2, . . . k−1, respectively. There is a total of k reference clocks being outputted, wherein frequencies of these k reference clocks are the same and a specific phase difference (i.e. 360°/k) exists between two adjacent ones of the reference clocks PHOR(−180°/k+360°*i/k), i=0, 1, 2, . . . k−1.

A lower part of FIG. 5 illustrates an output clock generator 550. The multiphase clock divider 50 may include one or more output clock generators. Since the structure of each output clock generator may be largely similar, only a single output clock generator is illustrated in FIG. 5 for easy reference. As shown in FIG. 5, the output clock generator 550 includes multiplexers $MUX_1$-$MUX_4$ and D flip-flops $DFF_A$, $DFF_B$. In the output clock generator 550, the implementation of the D flip-flops $DFF_A$, $DFF_B$ is only an example, and the flip-flops can be implemented by any type of flip-flop or other devices having sampling functions, which are not limited herein. The multiplexer $MUX_1$, coupled to the reference clock generator 500, is utilized for selecting to output one of the reference clocks PHOR(−180°/k+360°*i/k), i=0, 1, 2, . . . k−1 as a selected reference clock $CK_R$. The input clocks PHI(360°*i/N), i=0, 1, . . . N−1 can be divided into two groups PHI(g1) and PHI(g2), according to system requirements for set-up time for example. The multiplexer $MUX_2$ is utilized for selecting to output an input clock from among the group PHI(g1) as a selected input clock $CK_1$. The multiplexer $MUX_3$ is utilized for selecting to output an input clock from among the group PHI(g2) as another selected input clock $CK_2$. The D flip-flop $DFF_A$ includes a data input terminal coupled to the multiplexer $MUX_1$, for receiving the selected reference clock $CK_R$; a clock input terminal coupled to the multiplexer $MUX_2$, for receiving the selected input clock $CK_1$; and a data output terminal for outputting a sampling clock $CK_{S1}$. The D flip-flop $DFF_B$ includes a data input terminal coupled to the data output terminal of the D flip-flop $DFF_A$, for receiving the sampling clock $CK_{S1}$; a clock input terminal coupled to the multiplexer $MUX_3$, for receiving the selected input clock $CK_2$; and a data output terminal for outputting a sampling clock $CK_{S2}$. The multiplexer $MUX_4$, coupled to the data output terminal of the D flip-flop $DFF_A$ and the data output terminal of the D flip-flop $DFF_B$, is utilized for selecting to output the sampling clock $CK_{S1}$ or the sampling clock $CK_{S2}$ to generate an output clock $S_{out}$.

Figure 6:
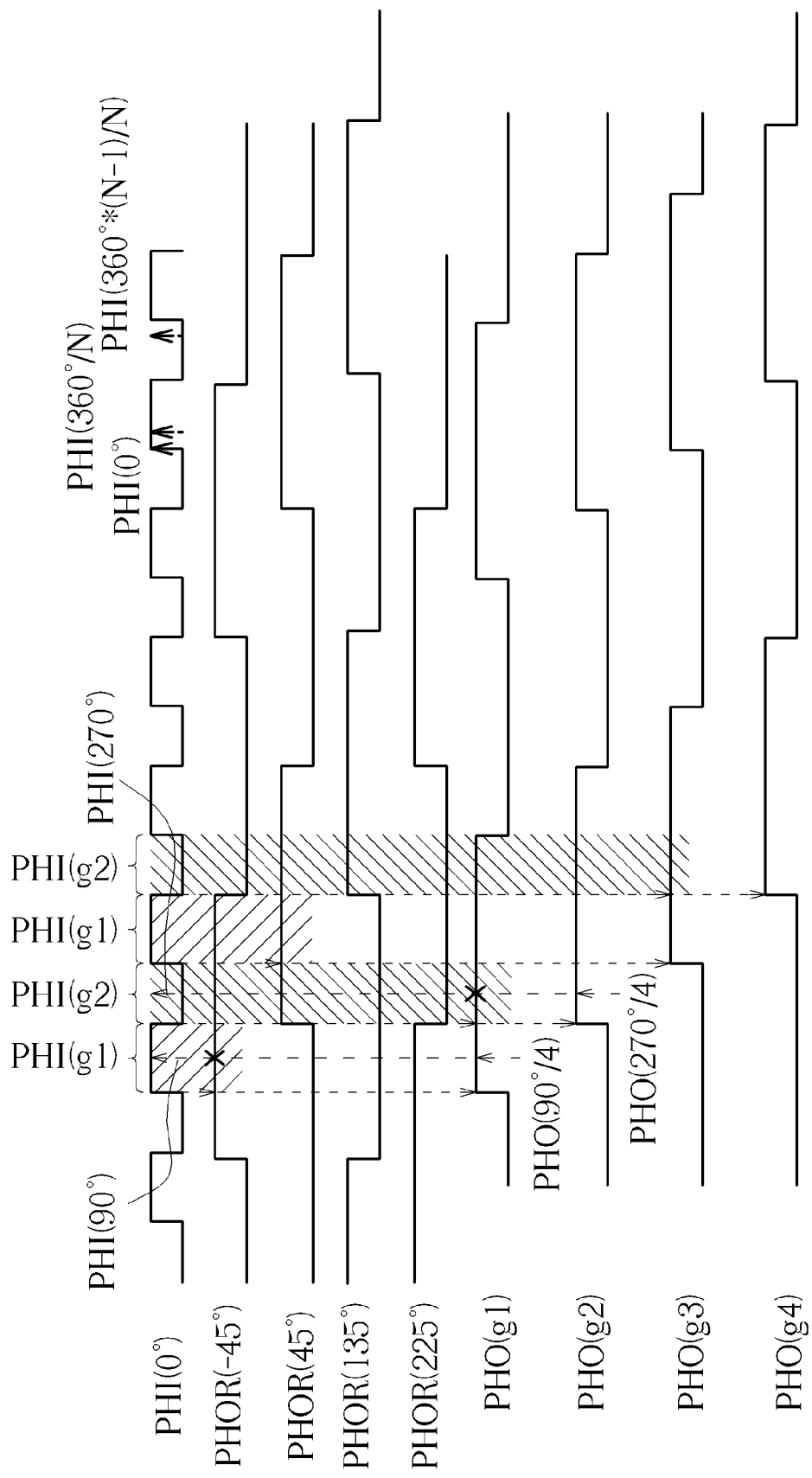
FIG. 6 is a waveform diagram of a multiphase clock divider according to an embodiment of the present invention.

Please note that the above method for dividing the input clocks PHI(360°*i/N), i=0, 1, . . . N−1 into the groups PHI(g1) and PHI(g2) can be modified according to system requirements for set-up time. Taking a k=4 (i.e. m=2) multiphase clock divider 50 as an example, please refer to FIG. 6, which is a waveform diagram of the k=4 (i.e. m=2) multiphase clock divider 50. As shown in FIG. 6, since k=4, the reference clock generator 500 generates four reference clocks PHOR(−45°), PHOR(45°), PHOR(135°), and PHOR(225°) via four flip-flops. Assuming that all of the D flip-flops $DFF_1$-$DFF_k$, $DFF_A$, and $DFF_B$ in FIG. 5 are triggered at positive edges of clocks. Since the D flip-flops $DFF_1$-$DFF_k$ in the reference clock generator 500 are all triggered by the inverted input clock PHI(180°), the reference clocks PHOR(−45°), PHOR(45°), PHOR(135°), and PHOR(225°) will then be switched at negative edges of the non-inverted input clock PHI(0°).

To ensure all of the sampling flip-flops possess a set-up time which is at least half a cycle time T of the input clocks, among the input clocks PHI(360°*i/N), i=0, 1, . . . N−1, the input clocks with phases in front of T/2 may be classified into the group PHI(g1), and the others may be classified into the group PHI(g2) (i.e. PHI(g1)=0°, 360°/N, . . . , and (180°−360°/N), and PHI(g2)=180°, 180°+360°/N, . . . , and (360°*(N−1)/N)). As a result, the input clocks classified into the group PHI(g1) may perform sampling of the reference clocks PHOR(−180°/k+360°*i/k), i=0, 1, 2, . . . k−1 to generate the output clock $S_{out}$ (i.e. the signal is sampled by the D flip-flop $DFF_A$, and then selected by the multiplexer $MUX_4$ to output the sampling clock $CK_{S1}$ to generate the output clock $S_{out}$); the input clocks classified into the group PHI(g2) perform sampling of the sampling clock $CK_{S1}$ to generate the output clock $S_{out}$, wherein the sampling clock $CK_{S1}$ is first generated by the non-inverted input clock PHI(0°) performing sampling of the reference clocks PHOR(−180°/k+360°*i/k), i=0, 1, 2, . . . k−1, (i.e. the signal is sampled by the D flip-flop $DFF_A$, then sampled by the D flip-flop $DFF_B$, and finally selected by the multiplexer $MUX_4$ to output the sampling clock $CK_{S2}$ to generate the output clock $S_{out}$). For example, as shown in FIG. 6, the input clock PHI(90°) is classified into the group PHI(g1). The input clock PHI(90°) performs sampling of the reference clock PHOR(−45°) via the D flip-flop $DFF_A$ to generate the sampling clock $CK_{S1}$=PHO(90°/4). At this moment, the multiplexer $MUX_4$ may be controlled to select the sampling clock $CK_{S1}$=PHO(90°/4) as the output clock $S_{out}$. The input clock PHI(270°) is classified into the group PHI(g2). The reference clock PHOR(−45°) is first sampled by the non-inverted input clock PHI(0°) via the D flip-flop $DFF_A$ to generate the sampling clock $CK_{S1}$=PHO(0°), and then the input clock PHI(270°) performs sampling of the sampling clock $CK_{S1}$=PHO(0°) via the D flip-flop $DFF_B$ to generate the sampling clock $CK_{S2}$=PHO(270°/4). At this moment, the multiplexer $MUX_4$ may be controlled to select the sampling clock $CK_{S2}$=PHO(270°/4) as the output clock $S_{out}$.

Please keep referring to FIG. 6. During the process of the input clock PHI(90°) generating the output clock $S_{out}$=PHO(90°/4), a sampling is performed of the reference clock PHOR(−45°) via the D flip-flop $DFF_A$. As shown in FIG. 6, set-up time of this sampling is ⅜*T (T represents a cycle time of the input clocks). Therefore, all of the input clocks classified into group PHI(g1) where the input clock PHI(90°) is located may perform sampling of the reference clock PHOR(−45°), so as to generate all output clocks in group PHO(g1), and the set-up times are all greater than ½*T. During the process of the input clock PHI(270°) generating the output clock $S_{out}$=PHO(270°/4), a sampling is performed first of the reference clock PHOR(−45°) via the D flip-flop $DFF_A$, and then another sampling is performed of the sampling clock $CK_{S1}$=PHO(0°) via the D flip-flop $DFF_B$. As shown in FIG. 6, set-up time of the first sampling is ½*T, and set-up time of the second sampling is ⅜*T (T represents a cycle time of the input clocks). Therefore, all of the input clocks classified into the group PHI(g2) where the input clock PHI(270°) is located may perform sampling of the sampling clock $CK_{S1}$=PHO(0°), so as to generate all output clocks in group PHO(g2), and the set-up times are all greater than ½*T. As a result, all of the sampling flip-flops are ensured to possess a set-up time which is at least half a cycle of the input clocks.

Furthermore, when the group PHI(g1) performs sampling of the reference clock PHOR(−45°) to generate the group PHO(g1), the next group PHI(g1) can also perform sampling of the reference clock PHOR(45°) to generate group PHO (g3), etc. When the group PHI(g2) performs sampling of the sampling clock $CK_{S1}$=PHO(0°) to generate the group PHO (g2), the next group PHI(g2) can also perform sampling of the sampling clock $CK_{S1}$=PHO(90°) to generate group PHO(g4), etc. As a result, for a k=4 (i.e. m=2) multiphase clock divider 50, the possible phases of the output clock $S_{out}$ can be divided into 4*2=8 groups PHO(g1)-PHO(g8), respectively. FIG. 6 only illustrates waveforms of the former four groups PHO (g1)-PHO(g4), and those skilled in the art can determine the waveforms of the other groups of the output clock $S_{out}$ accordingly.

A specific example is described as follows according to the above embodiment. Taking the multiphase clock divider 50 with N=8, k=4 as an example: all of the selectable output clocks $S_{out}$ may be divided into 8 groups, and thus have 8*4=32 phases PHO(360°*i/32) (i=0, 1, . . . , 31). These 8 groups may further be divided into an odd group (the first, third, fifth, and seventh groups) and an even group (the second, fourth, sixth, and eighth groups). The odd group in accordance with the circuits in FIG. 5 is described as follows:

The odd group: i=0-3, 8-11, 16-19, 24-27
$CK_R$=PHOR(−45°), PHOR(45°), PHOR(135°), and PHOR(225°)
$CK_1$=PHI(mod(i,4)*360°/8)
$CK_2$=(omitted)
$S_{out}$=$CK_{S1}$ The even group in accordance with the circuits in FIG. 5 is described as follows:

The even group: i=4-7, 12-15, 20-23, 28-31
$CK_R$=PHOR(−45°), PHOR(45°), PHOR(135°), and PHOR(225°)
$CK_1$=PHI(0°)
$CK_2$=PHI(180°+mod(i,4)*360°/8)
$S_{out}$=$CK_{S2}$ A control module can be utilized for controlling all of the multiplexers and flip-flops in the output clock generator 550 to operate in accordance with the above method; thus all of the sampling flip-flops are ensured to possess a set-up time which is at least half a cycle time of the input clocks.

Please note that the spirit of the above embodiment is to design the system according to timing margin requirements. Those skilled in the art can make modifications or alterations accordingly. For example, the above embodiments can ensure that the sampling flip-flops possess a set-up time which is at least half a cycle time of the input clocks. In some embodiments the system may also be designed according to a criterion that the sampling flip-flops possess a hold time which is at least half a cycle time of the input clocks. In practice, those skilled in the art can perform any adjustments according to timing margin requirements, and make a tradeoff between set-up time and hold time. Therefore, all of the multiphase clock dividing methods and corresponding multiphase clock dividers according to the above principle are included in the scope of the present invention.

Figure 7:
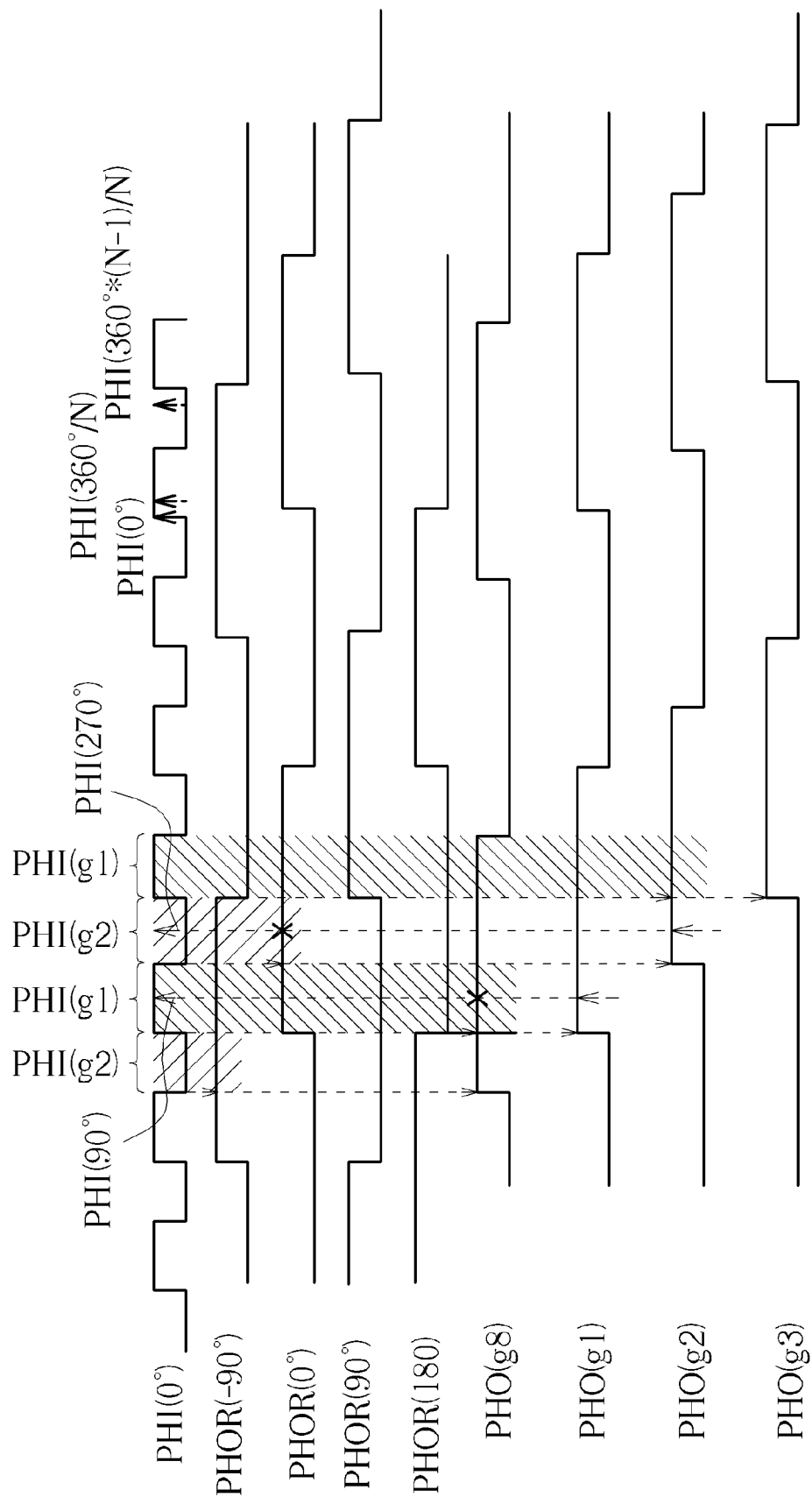
FIG. 7 is a waveform diagram of another multiphase clock divider according to an embodiment of the present invention.

In some embodiments, the output clocks with phases corresponding to the second half clock cycle may be generated first, so that several flip-flops may be designed to be triggered at negative edges of clocks. As shown in FIG. 7, since k=4, the reference clock generator 500 generates four reference clocks PHOR(−90°), PHOR(0°), PHOR(90°), and PHOR(180°) via four flip-flops. Assuming that, in FIG. 5, the D flip-flops $DFF_1$-$DFF_k$ are all triggered at negative edges of clocks and the D flip-flops $DFF_A$ and $DFF_B$ are both triggered at positive edges of clocks, since the D flip-flops $DFF_1$-$DFF_k$ in the reference clock generator 500 are all triggered by the inverted input clock PHI(180°), the reference clocks PHOR(−90°), PHOR(0°), PHOR(90°), and PHOR(180°) will then be switched at positive edges of the non-inverted input clock PHI(0°).

To ensure all of the sampling flip-flops possess a set-up time which is at least half a cycle time T of the input clocks, among the input clocks PHI(360°*i/N), i=0, 1, . . . N−1, the input clocks with phases behind T/2 may be classified into the group PHI(g2), and the others may be classified into the group PHI(g1) (i.e. PHI(g1)=0°, 360°/N, . . . , and (180°−360°/N), and PHI(g2)=180°, 180°+360°/N, . . . , and (360°*(N−1)/N)). As a result, the input clocks classified into the group PHI(g2) may perform sampling of the reference clocks PHOR(360°*i/k), i=0, 1, 2, . . . k−1 to generate the output clock $S_{out}$ (i.e. the signal is sampled by the D flip-flop $DFF_A$, and then selected by the multiplexer $MUX_4$ to output the sampling clock $CK_{S1}$ to generate the output clock $S_{out}$); the input clocks classified into the group PHI(g1) perform sampling of the sampling clock $CK_{S1}$ to generate the output clock $S_{out}$, wherein the sampling clock $CK_{S1}$ is first generated by the inverted input clock PHI(180°) performing sampling of the reference clocks PHOR(360°*i/k), i=0, 1, 2, . . . k−1, (i.e. the signal is sampled by the D flip-flop $DFF_A$, then sampled by the D flip-flop $DFF_B$, and finally selected by the multiplexer $MUX_4$ to output the sampling clock $CK_{S2}$ to generate the output clock $S_{out}$). For example, as shown in FIG. 7, the input clock PHI(90°) is classified into the group PHI(g1). The reference clock PHOR (−90°) is first sampled by the inverted input clock PHI(180°) via the D flip-flop $DFF_A$ to generate the sampling clock $CK_{S1}$=PHO(−45°), and then the input clock PHI(90°) performs sampling of the sampling clock $CK_{S1}$=PHO(−45°) via the D flip-flop $DFF_B$ to generate the sampling clock $CK_{S2}$=PHO(90°/4). At this moment, the multiplexer $MUX_4$ may be controlled to select the sampling clock $CK_{S2}$=PHO (90°/4) as the output clock $S_{out}$. The input clock PHI(270°) is classified into the group PHI(g2). The input clock PHI(270°) performs sampling of the reference clock PHOR(0°) via the D flip-flop $DFF_A$ to generate the sampling clock $CK_{S1}$=PHO (270°/4). At this moment, the multiplexer $MUX_4$ may be controlled to select the sampling clock $CK_{S1}$=PHO(270°/4) as the output clock $S_{out}$.

Please keep referring to FIG. 7. During the process of the input clock PHI(90°) generating the output clock $S_{out}$=PHO (90°/4), a sampling is performed first of the reference clock PHOR(−90°) via the D flip-flop $DFF_A$, and then another sampling is performed of the sampling clock $CK_{S1}$=PHO(−45°) via the D flip-flop $DFF_B$. As shown in FIG. 7, set-up time of the first sampling is ½*T, and set-up time of the second sampling is ⅜*T (T represents a cycle time of the input clocks). Therefore, all of the input clocks classified into the group PHI(g1) where the input clock PHI(90°) is located may perform sampling of the sampling clock $CK_{S1}$=PHO(−45°), so as to generate all output clocks in group PHO(g1), and the set-up times are all greater than ½*T. During the process of the input clock PHI(270°) generating the output clock $S_{out}$=PHO(270°/4), a sampling is performed of the reference clock PHOR(0°) via the D flip-flop $DFF_A$. As shown in FIG. 7, set-up time of this sampling is ⅜*T (T represents a cycle time of the input clocks). Therefore, all of the input clocks classified into group PHI(g2) where the input clock PHI (270°) is located may perform sampling of the reference clock PHOR(0°), so as to generate all output clocks in group PHO(g2), and the set-up times are all greater than ½*T. As a result, it is ensured that all of the sampling flip-flops possess a set-up time which is at least half a cycle time of the input clocks.

Furthermore, when the group PHI(g1) performs sampling of the sampling clock $CK_{S1}$=PHO(−45°) to generate the group PHO(g1), the next group PHI(g1) can also perform sampling of the sampling clock $CK_{S1}$=PHO(45°) to generate group PHO(g3), etc. When the group PHI(g2) performs sampling of the reference clock PHOR(0°) to generate the group PHO(g2), the next group PHI(g2) can also perform sampling of the reference clock PHOR(90°) to generate group PHO (g4), etc. As a result, for a k=4 (i.e. m=2) multiphase clock divider 50, the possible phases of the output clock $S_{out}$ can be divided into 4*2=8 groups PHO(g1)-PHO(g8), respectively. FIG. 7 only illustrates waveforms of the groups PHO(g8) and PHO(g1)-PHO(g3), and those skilled in the art can determine the waveforms of the other groups of the output clock $S_{out}$ accordingly.

A specific example is described as follows according to the above embodiment. Taking the multiphase clock divider 50 with N=8, k=4 as an example: all of the selectable output clocks $S_{out}$ may be divided into 8 groups, and thus have 8*4=32 phases PHO(360°*i/32) (i=0, 1, . . . , 31). These 8 groups may further be divided into an odd group (the first, third, fifth, and seventh groups) and an even group (the second, fourth, sixth, and eighth groups). The odd group in accordance with the circuits in FIG. 5 is described as follows:

The odd group: i=0-3, 8-11, 16-19, 24-27
$CK_R$=PHOR(−90°), PHOR(0°), PHOR(90°), and PHOR (180°)
$CK_1$=PHI(180°)
$CK_2$=PHI(mod(i,4)*360°/8)
Sout=$CK_{S2}$ The even group in accordance with the circuits in FIG. 5 is described as follows:

The even group: i=4-7, 12-15, 20-23, 28-31
$CK_R$=PHOR(−90°), PHOR(0°), PHOR(90°), and PHOR (180°)
$CK_1$=PHI(180°+mod(i,4)*360°/8)
$CK_2$=(omitted)
Sout=$CK_{S1}$ A control module can be utilized for controlling all of the multiplexers and flip-flops in the output clock generator 550 to operate in accordance with the above method; thus all of the sampling flip-flops are ensured to possess a set-up time which is at least half a cycle time of the input clocks.

Please note that the above embodiment illustrates a system with N input clocks and one output clock $S_{out}$, and the output clock $S_{out}$ can be selected from N*k selectable output clocks PHO(0°), PHO(360°/N/k), . . . , PHO(360°*(N*k−1)/N/k) with a multiplexer. Therefore, N input clocks PHI(0°), PHI (360°/N), . . . , and PHI(360°*(N−1)/N) have to be utilized for the output clock generator 550 to perform grouping and selection, wherein a specific phase difference (i.e. 360°/N) exists between these N input clocks. In other embodiments, however, only a few output clocks are required for selection; not all of the N*k selectable output clocks are required to be generated, such that not all of the N input clocks are required to be utilized. In detail, only the non-inverted input clock PHI(0°) and the inverted input clock PHI(180°) have to be utilized in the reference clock generator 500, and among the N input clocks PHI(0°), PHI(360°/N), . . . , and PHI(360°* (N−1)/N), only the corresponding input clocks PHI(y°) are required according to the requirements for selectable output clocks PHO(x°). Therefore, system complexity and circuit area may be reduced significantly.

According to the above description, the multiphase clock divider 50 may first generate output clocks with phases corresponding to the first half clock cycle, and then delay the former output clocks to generate output clocks with phases corresponding to the second clock cycle. Or, the multiphase clock divider 50 may first generate output clocks with phases corresponding to the second half clock cycle, and then delay the former output clocks to generate output clocks with phases corresponding to the first half clock cycle. In practice, to generate output clocks with phases corresponding to the first half clock cycle or the second half clock cycle first can be determined according to system requirements, and thus reference clocks which are not required can be saved, so as to save flip-flop numbers in the reference clock generator 500. By duplicating the output clock generator 550, a system with multiple (N or less than N) input clocks and multiple output clocks may also be realized with the above embodiments, wherein each output clock may possess the same or different phases.

Figure 8:
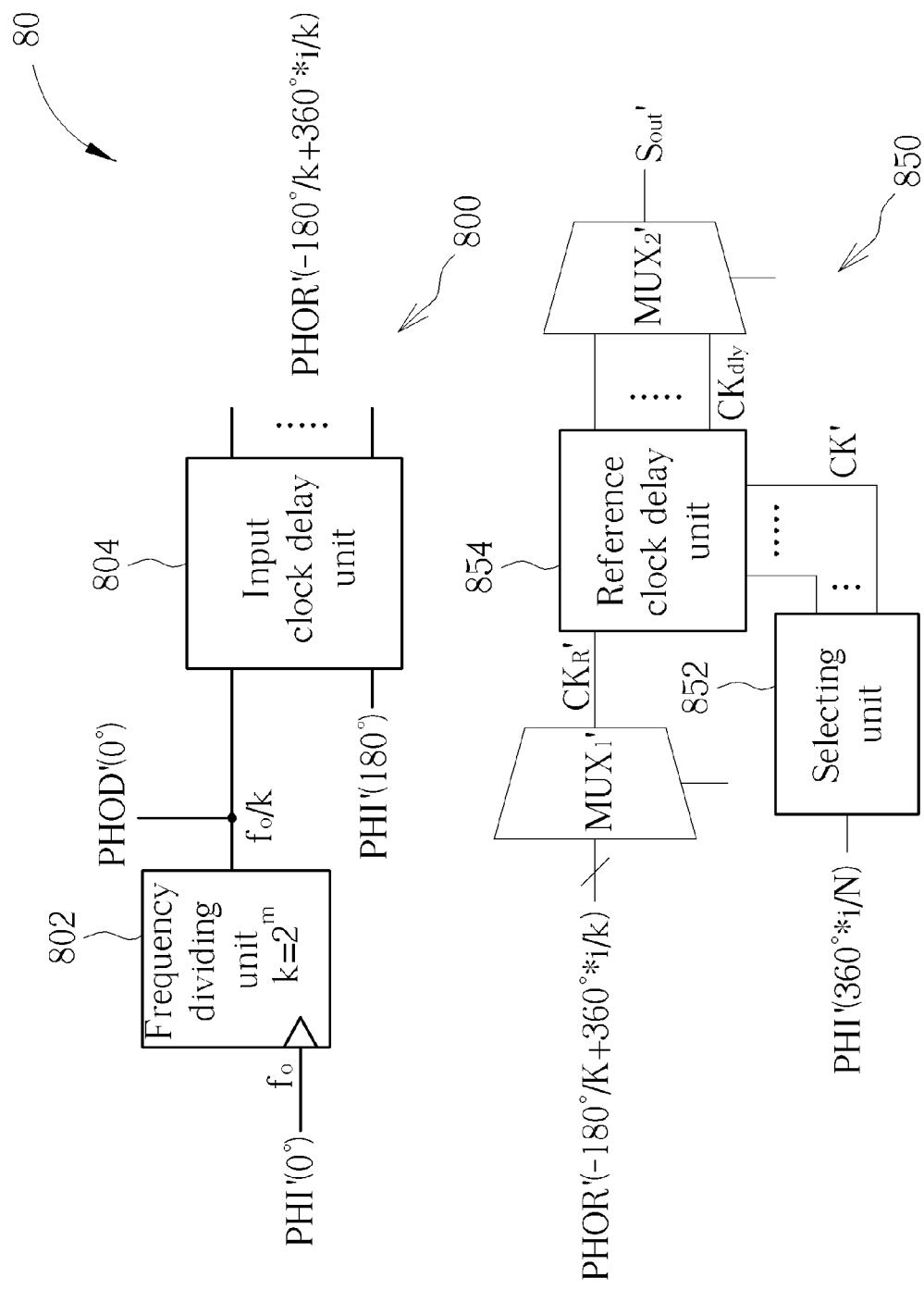
FIG. 8 is a schematic diagram of another multiphase clock divider according to an embodiment of the present invention.

In some embodiments, input clocks may also be divided into more than three groups or may not be divided at all. Similarly, the number of flip-flops utilized in the output clock generator may also be greater than three or only one. Please refer to FIG. 8, which is a schematic diagram of another multiphase clock divider 80 according to an embodiment of the present invention. The multiphase clock divider 80 is a divide-by-k clock divider. An upper part of FIG. 8 illustrates a reference clock generator 800 for generating 1-k reference clocks. The reference clock generator 800 includes a frequency dividing unit 802 and an input clock delay unit 804. The frequency dividing unit 802 divides a non-inverted input clock PHI'(0°) among input clocks PHI'(360°*i/N) by k to output a frequency-divided output clock PHOD'(0°), wherein i can be any positive integer between 0 and N−1. Among the input clocks PHI'(360°*i/N), which input clocks should be utilized can be determined according to system requirements (i.e. to select the required i). The input clock delay unit 804 is utilized for being triggered by an inverted input clock PHI' (180°) among the input clocks PHI'(360°*i/N), to delay the frequency-divided output clock PHOD'(0°) by different times in order to generate reference clocks PHOR'(−180°/k+ 360°*i/k), wherein i can be any positive integer between 0 and k−1. Among the reference clocks PHOR'(−180°/k+360°*i/k), which reference clocks should be utilized can be determined according to system requirements (i.e. to select the required i). In the input clock delay unit 804, a plurality of flip-flops may be connected in series to create the delay, for generating the different reference clocks PHOR'(−180°/k+360°*i/k) with different time delays. Other methods may also be utilized for generating reference clocks, which are not limited herein.

A lower part of FIG. 8 illustrates an output clock generator 850. The multiphase clock divider 80 may include one or more output clock generators. Since the structure of each output clock generator may be largely similar, only a single output clock generator is illustrated in FIG. 8 for easy reference. As shown in FIG. 8, the output clock generator 850 includes multiplexers $MUX_1'$ and $MUX_2'$, a selecting unit 852, and a reference clock delay unit 854. The multiplexer $MUX_1'$, coupled to the reference clock generator 800, is utilized for selecting to output one of the reference clocks PHOR'(−180°/k+360°*i/k) as a selected reference clock $CK_R'$. The selecting unit 852 is utilized for selecting to output a selected input clock CK' from among the input clocks PHI' (360°*i/N). The reference clock delay unit 854 is triggered by the selected input clock CK', to delay the selected reference clock $CK_R'$ by different times to generate different delayed reference clocks $CK_{dly}'$. The multiplexer $MUX_2'$, coupled to the reference clock delay unit 854, is utilized for selecting to output one of the delayed reference clocks $CK_{dly}'$ to generate an output clock $S_{out}'$. In the selecting unit 852, the input clocks PHI'(360°*i/N) may be divided into a plurality of groups first; then, by utilizing a plurality of multiplexers, an input clock may be selected from each group as one of the selected input clocks CK'. Other methods may also be utilized for selecting the selected input clocks CK' among the input clocks PHI'(360°*i/N), which are not limited herein. In the reference clock delay unit 854, a plurality of flip-flops may be connected in series to create the delay for generating the different delayed reference clocks $CK_{dly}$ which are delayed by different times. Other methods may also be utilized for performing delay, which are not limited herein.

An embodiment in accordance with a multiphase clock generating method may include the following steps: generate a plurality of reference clocks, wherein frequencies of the plurality of reference clocks are the same and a specific phase difference exists between the reference clocks; select a reference clock from among the plurality of reference clocks as a selected reference clock; select an input clock from among a first group of a plurality of input clocks as a first selected input clock; similarly, select an input clock from among a second group of the plurality of input clocks as a second selected input clock; then, utilize the first selected input clock to perform sampling of the selected reference clock to obtain a first sampling clock, and utilize the second selected input clock to perform sampling of the first sampling clock to obtain a second sampling clock; finally, select between the first sampling clock and the second sampling clock to generate an output clock.

The above method for generating the plurality of reference clocks may include the following steps: divide a non-inverted input clock among the plurality of input clocks by a predefined value to output a frequency-divided output clock; utilize an inverted input clock from among the plurality of input clocks to perform sampling of the frequency-divided output clock to generate a first reference clock among the plurality of reference clocks; and utilize the inverted input clock to perform sampling of the (i)th reference clock of the plurality of reference clocks to generate the (i+1)th reference clock of the plurality of reference clocks, wherein i=1, 2, . . . , M−1 and M is a total number of the plurality of reference clocks, to generate the plurality of reference clocks. Other related details are described in the above with respect to other embodiments, and therefore is not narrated herein for brevity.

Noticeably, the term "coupled to" utilized in the above embodiments may refer to any direct or indirect connections. For example, when a first device is coupled to a second device, it can be realized by directly connecting the first device to the second device, or be realized by indirectly connecting the first device to the second device via other devices or any other physical or non-physical means.

In the prior art, a detect-and-reset multiphase clock divider requires detect-and-reset control circuits for ensuring accurate phase. When the divisor of the clock divider increases, even if there is only one output clock, the required input clocks and control circuits may still increase significantly. In addition, the detect-and-reset control circuits need to utilize double the input frequency for detection, such that an operational speed of the system will be reduced. Set-up time of the delay type multiphase clock divider is $f_o/N$, wherein $f_o$ is frequency of the input clock, and N is the number of phases. When N becomes greater, the set-up time will fall accordingly, which may limit the operational speed of the system. In comparison, the above embodiments of the present invention can be designed by generating reference clocks according to timing margin requirements, and thus the sampling flip-flops can be ensured to possess a set-up time and/or hold time which is at least half a cycle time of the input clocks. The above embodiments of the present invention may only require input clocks PHI(y°) corresponding to the requirements for selectable output clocks PHO(x°). Therefore, system complexity and circuit area may be reduced significantly. Only the minimum number of input clocks and other corresponding clocks are required for the reference clock generator together with the output clock generator to generate output clocks with any phase.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multiphase clock divider, comprising:
a reference clock generator, for generating a plurality of reference clocks, wherein frequencies of the plurality of reference clocks are the same and a specific phase difference exists between the reference clocks; and
at least one output clock generator, comprising:
a first multiplexer, coupled to the reference clock generator, for selecting to output one of the plurality of reference clocks as a selected reference clock;
a second multiplexer, for selecting to output an input clock from among a first group of a plurality of input clocks as a first selected input clock;
a third multiplexer, for selecting to output an input clock from among a second group of the plurality of input clocks as a second selected input clock;
a first flip-flop, comprising:
a data input terminal, coupled to the first multiplexer, for receiving the selected reference clock;
a clock input terminal, coupled to the second multiplexer, for receiving the first selected input clock; and
a data output terminal, for outputting a first sampling clock;
a second flip-flop, comprising:
a data input terminal, coupled to the data output terminal of the first flip-flop, for receiving the first sampling clock;
a clock input terminal, coupled to the third multiplexer, for receiving the second selected input clock; and
a data output terminal, for outputting a second sampling clock; and
a fourth multiplexer, coupled to the data output terminal of the first flip-flop and the data output terminal of the second flip-flop, for selecting to output the first sampling clock or the second sampling clock to generate an output clock.

2. The multiphase clock divider of claim 1, wherein the reference clock generator comprises:
a frequency dividing unit, for dividing a non-inverted input clock among the plurality of input clocks by a predefined value to output a frequency-divided output clock; and
a plurality of third flip-flops, connected in series, each third flip-flop comprising:
a data input terminal;
a clock input terminal, coupled to an inverted input clock among the plurality of input clocks; and
a data output terminal, for outputting a reference clock from among the plurality of reference clocks;
wherein the data input terminal of a foremost third flip-flop among the plurality of third flip-flops is coupled to the frequency dividing unit for receiving the frequency-divided output clock, and the data input terminal of each of the other third flip-flops is coupled to the data output terminal of a previous third flip-flop.

3. The multiphase clock divider of claim 2, wherein the reference clock generator further comprises an inverter, for converting the non-inverted input clock among the plurality of input clocks to generate the inverted input clock among the plurality of input clocks.

4. The multiphase clock divider of claim 2, wherein the predefined value is equal to a total number of the plurality of reference clocks.

5. The multiphase clock divider of claim 2, wherein the predefined value is k, and phases of the plurality of reference clocks are (−180°/k+360°*i/k), respectively, wherein i is a positive integer and i=0, 1, . . . (k−1).

6. The multiphase clock divider of claim 1, wherein the first group and the second group of the plurality of input clocks are selected from the plurality of input clocks according to set-up time of the first flip-flop and set-up time of the second flip-flop.

7. The multiphase clock divider of claim 1, wherein phases of the input clocks among the first group comprise: 0°, 360°/N, . . . , and (180°−360°/N), and phases of the input clocks among the second group comprise: 180°, 180°+360°/N, . . . , and (360°*(N−1)/N), wherein N is a positive integer.

8. The multiphase clock divider of claim 7, wherein set-up time of the first flip-flop and set-up time of the second flip-flop are both T/2, wherein T is a cycle time of the input clock.

9. The multiphase clock divider of claim 1, wherein phases of the input clocks among the first group comprise: −90°, −90°+360°/N, . . . , and (180°−360°/N), and phases of the input clocks among the second group comprise: 180°, 180°+360°/N, . . . , and (270°−360°/N), wherein N is a positive integer.

10. The multiphase clock divider of claim 9, wherein set-up time of the first flip-flop and set-up time of the second flip-flop are 3T/4 and T/4, respectively, wherein T is a cycle time of the input clock.

11. The multiphase clock divider of claim 1, further comprising a control module, for controlling the first to the fourth multiplexers.

12. The multiphase clock divider of claim 11, wherein the control module controls the first to the fourth multiplexers to operate in a first mode or in a second mode according to whether a desired phase of the output clock belongs to a first output phase group or a second output phase group, wherein at the first mode, the control module controls the second multiplexer to select to output an input clock from among the first group as the first selected input clock, and controls the fourth multiplexer to select to output the first sampling clock to generate the output clock; and at the second mode, the control module controls the second multiplexer to select to output a non-inverted input clock or an inverted input clock from among the first group as the first selected input clock, controls the third multiplexer to select to output an input clock from among the second group as the second selected input clock, and controls the fourth multiplexer to select to output the second sampling clock to generate the output clock.

13. The multiphase clock divider of claim 11, wherein the control module controls the second multiplexer to select to output an input clock from among the first group as the first selected input clock, and controls the fourth multiplexer to select to output the first sampling clock to generate the output clock.

14. The multiphase clock divider of claim 11, wherein the control module controls the second multiplexer to select to output a non-inverted input clock or an inverted input clock from among the first group as the first selected input clock, controls the third multiplexer to select to output an input clock from among the second group as the second selected input clock, and controls the fourth multiplexer to select to output the second sampling clock to generate the output clock.

15. A multiphase clock divider, comprising:
a reference clock generator, for generating a plurality of reference clocks, wherein frequencies of the plurality of reference clocks are the same and a specific phase difference exists between the reference clocks; and
at least one output clock generator, comprising:
a first multiplexer, coupled to the reference clock generator, for selecting to output one of the plurality of reference clocks as a selected reference clock;
a selecting unit, for selecting to output a plurality of selected input clocks from among a plurality of input clocks;
a reference clock delay unit, triggered by the plurality of selected input clocks, for delaying the selected reference clock by a plurality of different times to generate a plurality of delayed reference clocks; and
a third multiplexer, coupled to the reference clock delay unit, for selecting to output one of the plurality of delayed reference clocks to generate an output clock.

16. The multiphase clock divider of claim 15, wherein the plurality of input clocks are divided into a plurality of groups, and the selecting unit comprises a plurality of second multiplexers, wherein each of the plurality of second multiplexers is coupled to a group among the plurality of groups and selects to output an input clock from among the group as one of the plurality of selected input clocks.

17. The multiphase clock divider of claim 15, wherein the reference clock generator comprises:
a frequency dividing unit, for dividing a non-inverted input clock among the plurality of input clocks by a predefined value to output a frequency-divided output clock; and
an input clock delay unit, triggered by an inverted input clock among the plurality of input clocks, for delaying the frequency-divided output clock by different times to generate the plurality of reference clocks.

18. The multiphase clock divider of claim 17, wherein the input clock delay unit comprises a plurality of flip-flops, connected in series, each flip-flop comprising:
a data input terminal;
a clock input terminal, coupled to the inverted input clock; and
a data output terminal, for outputting a reference clock from among the plurality of reference clocks, wherein the data input terminal of a foremost flip-flop among the plurality of flip-flops is coupled to the frequency dividing unit for receiving the frequency-divided output clock, and the data input terminal of each of the other flip-flops is coupled to the data output terminal of a previous flip-flop.

19. The multiphase clock divider of claim 17, wherein the reference clock delay unit comprises a plurality of flip-flops, each comprising a data input terminal, a clock input terminal coupled to one of the plurality of selected input clocks, and a data output terminal for outputting one of the plurality of delayed reference clocks, wherein the data input terminal of a foremost flip-flop among the plurality of flip-flops is coupled to the first multiplexer for receiving the selected reference clock, and the data input terminal of each of the other flip-flops is coupled to the data output terminal of a previous flip-flop.

20. A multiphase clock divider, comprising:
  a reference clock generator, comprising:
    a frequency dividing unit, comprising an input terminal and an output terminal;
    an inverter, comprising an input terminal coupled to the input terminal of the frequency dividing unit, and an output terminal; and
    a plurality of third flip-flops, connected in series, each comprising a data input terminal, a clock input terminal, and a data output terminal,
  wherein the data input terminal of a foremost third flip-flop among the plurality of third flip-flops is coupled to the output terminal of the frequency dividing unit, the data input terminal of each of the other third flip-flops is coupled to the data output terminal of a previous third flip-flop, and the clock input terminal of each of the plurality of flip-flops is coupled to the output terminal of the inverter; and
    at least one output clock generator, comprising:
      a first multiplexer, comprising a plurality of input terminals coupled to the data output terminals of the plurality of third flip-flops in the reference clock generator, respectively, and an output terminal;
      a second multiplexer, comprising a plurality of input terminals and an output terminal;
      a third multiplexer, comprising a plurality of input terminals and an output terminal;
      a first flip-flop, comprising:
        a data input terminal, coupled to the output terminal of the first multiplexer;
        a clock input terminal, coupled to the output terminal of the second multiplexer; and
        a data output terminal;
      a second flip-flop, comprising:
        a data input terminal, coupled to the data output terminal of the first flip-flop;
        a clock input terminal, coupled to the output terminal of the third multiplexer; and
        a data output terminal; and
      a fourth multiplexer, comprising two input terminals coupled to the data output terminal of the first flip-flop and the data output terminal of the second flip-flop, respectively, and an output terminal.

\* \* \* \* \*